United States Patent [19]
Suzuki et al.

[11] Patent Number: 4,970,546
[45] Date of Patent: Nov. 13, 1990

[54] EXPOSURE CONTROL DEVICE

[75] Inventors: Kazuaki Suzuki, Tokyo; Akikazu Tanimoto; Masato Go, both of Yokohama, all of Japan

[73] Assignee: Nikon Corporation, Tokyo, Japan

[21] Appl. No.: 333,010

[22] Filed: Apr. 4, 1989

[30] Foreign Application Priority Data

Apr. 7, 1988 [JP] Japan ................................. 63-85616

[51] Int. Cl.⁵ ...................... G03B 27/42; G03B 27/72
[52] U.S. Cl. ........................................ 355/53; 355/69; 355/71; 355/77
[58] Field of Search ...................... 355/43, 45, 53, 54, 355/71, 77, 69; 362/268; 353/38, 122; 356/356

[56] References Cited

U.S. PATENT DOCUMENTS

| | | | |
|---|---|---|---|
| 4,497,015 | 1/1985 | Konno et al. | 355/67 |
| 4,619,508 | 10/1986 | Shibuya et al. | 355/67 |
| 4,653,903 | 3/1987 | Torigoe et al. | 355/53 |

FOREIGN PATENT DOCUMENTS 60-169136 9/1985 Japan.
63-81882 4/1988 Japan ...................................... 355/53

*Primary Examiner*—L. T. Hix
*Assistant Examiner*—D. Rutledge
*Attorney, Agent, or Firm*—Shapiro and Shapiro

[57] ABSTRACT

A simple illumination control device provides illuminating light with improved uniformity in intensity and without speckle fringes.

A speckle pattern, formed with a specific periodicity by the irradiation of a pulse on a first object or a second object, is moved within a predetermined range at least in one direction. The minimum number of pulses required for substantially smoothing the speckle pattern on the second object by irradiation of plural pulses during the movement of the speckle pattern over the predetermined range, is stored. Based on the minimum number of pulses, the number of pulses required for obtaining desired exposure, the amount of light of each pulse, and the number of pulses for moving the speckle pattern substantially by a cycle, are determined.

5 Claims, 8 Drawing Sheets

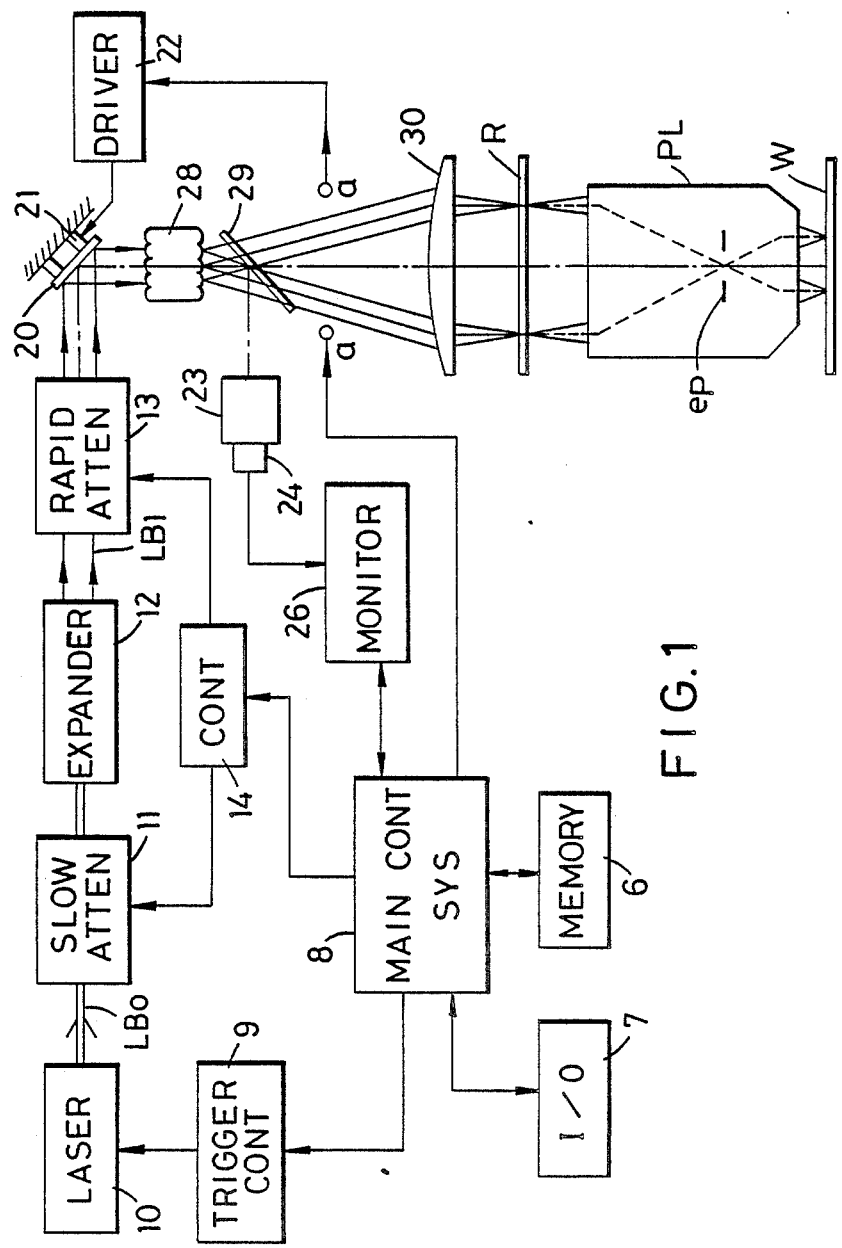
F I G. 1

EXPOSURE CONTROL DEVICE

BACKGROUND OF THE INVENTION

1. Field of the Invention

The present invention relates to control of irradiation energy to a sensitive object and control for achieving uniform illumination thereon, and more particularly to an exposure control device for exposure control and achievement of uniform illumination in an exposure apparatus utilizing a pulsed laser such as an excimer laser as the exposing light source.

2. Related Background Art

A conventional energy control device, for use, for example, as the exposure control device in an exposure apparatus for semiconductor device manufacture, is disclosed in the Japanese Laid-open Patent Sho No. 60-169136.

In said device, the fluctuation in the exposure energy given to a sensitive member, such as a wafer coated with photoresist, is reduced by dividing the exposure into a coarse exposure giving an exposure energy slightly smaller than the appropriate exposure, and a correcting exposure providing the necessary remaining exposure energy.

More specifically, in case of the exposure of one shot consisting of plural pulses, an optimum exposure is obtained by control with final pulses of smaller energy.

The above-mentioned shot means, in case of collective exposure method, the irradiation of an entire wafer with the exposure energy through a mask, or, in case of step-and-repeat method, the irradiation of a partial area of the wafer with the exposure energy.

However the laser beam employed as the energy source may result in unevenness in illumination intensity, called speckles, on the exposure plane, due to coherence of the laser beam, and such unevenness undesirably affects the line width control in the photolithographic process in the semiconductor device manufacture. A speckle reduction has therefore been proposed in the U.S. Pat. No. 4,619,508.

The speckle reduction in said patent consists of causing a two-dimensional vibration (raster scanning) of the laser beam with a predetermined period for example with a vibrating mirror, thereby slightly displacing the illuminating path of the laser beam and thus reducing the spatial coherency. If pulsed energy, such as an excimer laser beam, is applied to such illuminating system, plural pulses will be generated in synchronization with the two-dimensional scanning performed for example with a mirror. The pulse duration of an excimer laser is normally as short as about 20 nsec, so that each pulse of the excimer laser beam remains almost still in said two-dimensional vibration, when the mirror vibration is conducted with a frequency of several tens of cycles per second. FIG. 13 is a plan view of light source images (laser spots) on the pupil plane of the projection lens, obtained by the scanning motion of the laser beam according to the method disclosed in the above-mentioned U.S. Patent. It is assumed, in the exposure optical system, that the exit end of an optical integrator 28 is positioned conjugate with the pupil plane ep of the projection lens, thus constituting a so-called Koehler illumination system. When a parallel pulsed energy beam enters the optical integrator 28 with slightly varying incident angle by deflection for example with a mirror, the positions of the light spots SP formed on the exit faces of plural lens elements (for example rod lenses) constituting the integrator 28 also vary two-dimensionally. As the angle of said deflection is very small, said deflection can be obtained by driving a small mirror for example with a piezoelectric element.

FIG. 14 is a magnified view of a lens element 28' in the integrator 28. Pulses are suitably generated along the two-dimensional scanning path SL, so that the light spots SP are scattered in different positions in a raster scanning. It is to be noted that FIG. 14 is a schematic view, and the actual size of the light spot SP may become close to the size of the end face of the lens element 28'. In the example shown in FIG. 14, 11 pulses are generated in a single scanning. Said pulses may be positioned regularly or randomly on the end face of the lens element 28', during a single scanning operation.

In such method, plural pulses generated in a scanning with the mirror cause displacement of the speckle fringes (particularly interference fringes resulting from the arrangement of the lens elements 28') on the reticle serving mask or on the photosensitive wafer, and the unevenness in the illumination is reduced by the integration of plural pulses.

However, the means disclosed in the aforementioned Japanese Laid-Open Patent Sho No. 60-169136, lacking consideration on the fluctuation in the amount of energy contained in the final pulse, is still incapable of appropriate control of exposure and unable to achieve appropriate exposure. As pointed out in said patent, the fluctuation in exposure in the photolithographic process in the semiconductor device manufacture may result in a serious influence on the resolving power and in the reproducibility of the line width. On the other hand, the level of integration of integrated circuits is progressing in recent years, with increasing requirement for the resolving power. There is therefore required exposure control capable of controlling the exposure energy more precisely and achieving uniform illumination without speckle fringes.

SUMMARY OF THE INVENTION

An object of the present invention is to provide an exposure control device capable of controlling the amount of energy, such as the amount of exposure, with a required precision, and simultaneously achieving a uniform illumination intensity.

Another object of the present invention is to provide an illumination control device capable of providing illuminating light with improved uniformity in intensity and without speckle fringes, by means of a simpler structure.

In the present invention, there is provided, in the illuminating optical system, means (for example a vibrating mirror) for moving a speckle pattern, formed with a specific periodicity by the irradiation of a pulse (excimer laser beam) on a first object (reticle) or a second object (wafer), within a predetermined range at least in one direction. There is stored the minimum number of pulses required for substantially smoothing the speckle pattern on the second object by irradiation of plural pulses during the movement of the speckle pattern over the predetermined range, and, based on said minimum number of pulses, there are determined the number of pulses required for obtaining desired exposure, the amount of light of each pulse, and the number of pulses for moving the speckle pattern substantially by a cycle.

For smoothing the periodical speckle pattern formed on the sensitive second object, plural pulses are given during the movement of the speckle pattern over a certain range. In the use of an illuminating optical system employing a fly's eye lens, the minimum number of pulses to be generated during the movement by a pitch of the speckle pattern is limited to a predetermined value, and there have to be provided pulses of a number equal to or larger than said minimum number. The present invention is based on this principle.

The periodical speckle pattern as shown in Fig. 13 is generated by the mutual interference of the light spots SP formed by the lens elements of the integrator 28. Said interference may take place for example only between two light spots SP of two neighboring lens elements, or among three light spots SP of the lens elements in the direction of array thereof, but there need be considered the mutual interference of light spots SP of a number at maximum corresponding to the number of lens elements in the direction of array thereof.

Consequently, in theory, the minimum number of pulses to be irradiated during a half cycle is determined by the number of mutually interfering light spots, among all the lens elements constituting the optical integrator.

For example, if the interference takes place only between two neighboring light spots, the speckle pattern theoretically assumes a simple sinusoidal form, and the smoothing of said speckle pattern requires two pulses with a mutual phase difference of $\pi$, corresponding to a movement by a half cycle of the speckle pattern. In general, in case of mutual interference of n light spots, the smoothing is theoretically possible with n pulses, with each pulse at a movement of the speckle pattern by $1/n$ cycle.

However, in practice, the complete smoothing is scarcely achieved under such conditions, and the optimum minimum number $N_{min}$ of pulses to be generated during a half cycle of the beam oscillation required for the movement by a pitch of the speckle pattern has to be determined experimentally.

BRIEF DESCRIPTION OF THE DRAWINGS

FIG. 1 is a schematic view of an exposure apparatus embodying the present invention;

DESCRIPTION OF THE PREFERRED EMBODIMENTS

Figure 2:
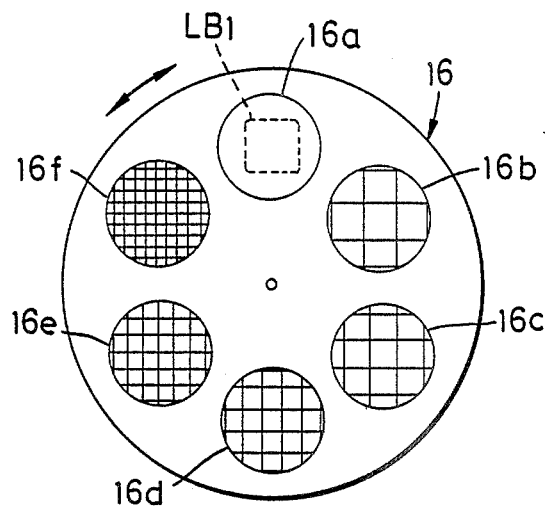
FIG. 2 is a plan view of a light amount regulating mechanism.

The present invention will be described in detail by an embodiment thereof, applied to a stepper for projecting the pattern of a reticle onto a wafer.

Referring to FIG. 1, a trigger control unit 9 for generating external trigger pulses controls the oscillation of a pulsed laser unit 10 generating pulsed light beams such as an excimer laser beam. Said pulsed laser 10 is constructed as a stable resonator type laser having a mechanism for reducing the band width and stabilizing the wavelength, composed for example of an etalon, a dispersing element etc. positioned between two resonance mirrors positioned on both ends of a laser tube. The laser beam $LB_0$ emitted from the pulsed laser 10 is in the deep UV range, for example of a wavelength of 248 nm, and has a rectangular cross section with a vertical-to-horizontal ratio of $\frac{1}{4}$–1/5. A low-speed attenuator 11 receives said beam $LB_0$ and reduces the light amount (energy) by 0% (complete transmission) to 100% (complete interception) in continuous level or in discrete levels. The attenuated beam enters a beam expander 12 composed of cylindrical lenses, and serving to emit a beam $LB_1$ of which cross section is transformed from the rectangular form to a substantially square form.

A high-speed attenuator or a rapid attenuator 13 receives the beam $LB_1$ and attenuates the energy thereof for example in six discrete levels. Said high-speed attenuator 13 is for example composed of six mesh filters of different attenuating rates (transmittances) mounted on a rotary turret plate, for enabling high-speed switching of the attenuating rate during the projection of pattern of the reticle R onto the wafer W through the projection lens PL. FIG. 2 shows an example of said turret plate 16 and six filters 16a, 16b, 16c, 16d, 16e and 16f, in which the filter 16a consists of a simple aperture, with an attenuating rate of 0% (transmittance of 100%). The filters 16a–16f are positioned along a circle around the rotary shaft of the turret plate 16, with a mutual angle of about 60°, so that one of said filters is positioned in the light path of the substantially square beam $LB_1$ from the beam expander 12.

Figure 3:
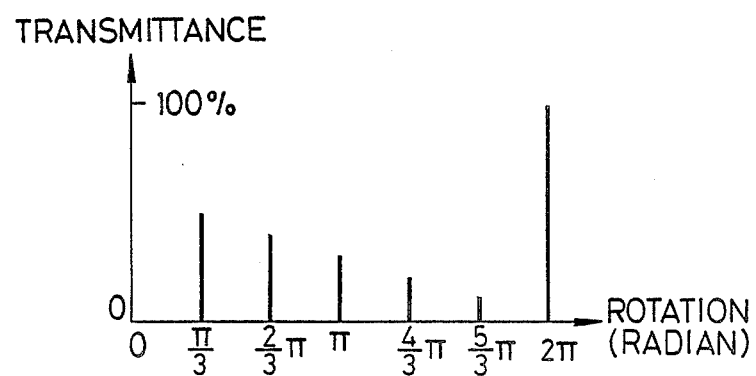
FIG. 3 is a chart showing the regulated light amounts obtained by the mechanism shown in FIG. 2.

FIG. 3 shows the relation between the angle of rotation of the rotary turret plate 16 shown in FIG. 2 and the transmitted light amount, which is attenuated by a predetermined rate for every rotation of about 60° ($\pi/3$). The transmitted light amount is 100% (attenuation of 0%) for a rotation of $2\pi$ (360° or 0°) because the filter 16a is selected.

The low-speed attenuator 11 and the high-speed attenuator 13 are both controlled by a light control unit 14. The low-speed attenuator 11 can have a slower response in comparison with the high-speed attenuator 13, but may be designed to achieve attenuation in discrete levels by means of plural mesh filters as shown in FIG. 2, or in continuous manner, in a combination of a rectangular aperture and a zoom lens system, by the change in the zooming ratio or in the aperture diameter.

The substantially parallel beam $LB_1$ after desired attenuation is reflected by a vibrating mirror 20 and enters a fly's eye lens 28 serving as an optical integrator. Said fly's eye lens 28 is composed of a bundle of plural rod-shaped element lenses and forms secondary light source images (light spots of the beam $LB_1$) of a number corresponding to that of the element lenses.

The vibrating mirror 20 vibrates one-dimensionally in the present embodiment, by means of an actuator employing, for example, a piezoelectric element. The center of vibration coincides with an imaginary line contained in the reflecting plane of the mirror 20, which therefore rotates by a small angle in reciprocating manner about said line. The piezoelectric element 21 is so driven by a piezo driver 22 as to obtain desired vibrating characteristics in the mirror 20. Consequently the beam $LB_1$ entering the fly's eye lens 28 varies its incident angle with respect to said lens 28.

Figure 4:
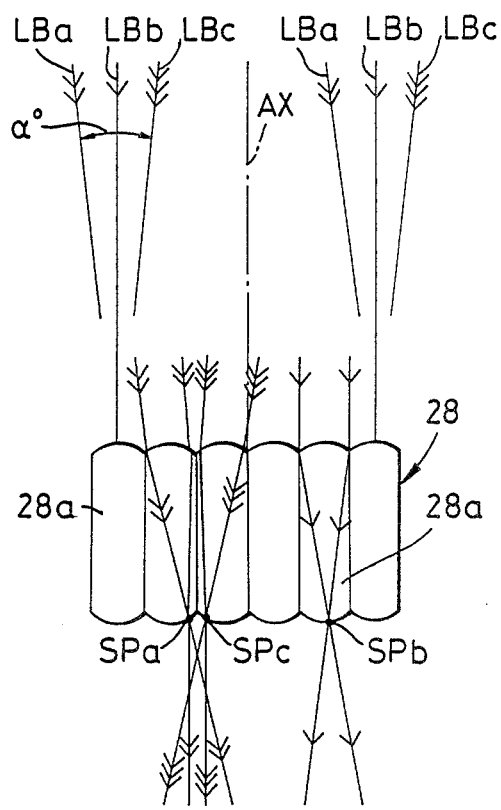
FIG. 4 is a schematic view showing the relation between a fly's eye lens and incident beams.

FIG. 4 is a schematic view showing the relation between the incident beam of the fly's eye lens 28 and the secondary light source images (light spots) according to the principle disclosed in the aforementioned U.S. Pat. No. 4,619,508. Each rod lens 28a of the fly's eye lens 28 is composed of a square quartz rod having convex spherical surfaces on both ends. When a parallel beam LBb enters the fly's eye lens 28 parallel to the optical axis thereof, a light spot SPb is formed at the exit end of each rod lens 28a, or at a position in the air spaced by a predetermined amount from said exit end. Though FIG. 4 shows only one light spot SPb formed on a rod lens, similar spots are formed in the exit side of all the rod lenses receiving said beam LBb, and each spot SPb is positioned at the approximate center of the exit face of the rod lens. Also a parallel beam LBa, inclined to left, with respect to the optical axis AX, in the plane of FIG. 4 is concentrated as a light spot SPa positioned at the right side of the exit plane of the rod lens 28a. On the other hand, a parallel beam LBc inclined to right with respect to the optical axis AX is concentrated as a light spot SPc positioned at the left side of the exit plane of the rod lens 28a.

Thus, in response to the one-dimensional vibration of the vibrating mirror 20, all the light spots formed at the exit side of the fly's eye lens 28 simultaneously vibrate in one direction in reciprocating manner, with respect to the optical axis AX of the fly's eye lens 28.

The plural beams constituting the light spots at the exit side of the fly's eye lens 28 are mostly transmitted by a beam splitter 29 as shown in FIG. 1, then enter a condenser lens 30 and are superposed on the reticle R. Thus the reticle R is illuminated with a substantially uniform illumination intensity, and the photoresist layer on the wafer W is exposed, through the projection lens PL, to the pattern of the reticle R. However there is generated unevenness of the exposure, due to the interference of the light spots. The plural light spots formed at the exit end of the fly's eye lens 28 are re-formed on the entrance pupil ep of the projection lens PL, whereby a so-called Koehler illuminating system is formed.

The wafer W is placed on a wafer stage of step-and-repeat method.

The vibrating mirror 20 vibrates, as explained before, to displace the interference fringes (one-dimensional speckle pattern) formed on the reticle or wafer by a small amount, thereby smoothing the fringes transferred onto the photoresist layer by the integrating effect at the end of exposure, thus reducing the visibility of the interference fringes. If the laser 10 including a stable resonator is used, the coherency of the beam in time is considerably reduced, but the spatial coherency is not sufficiently reduced, thus leaving speckles, due to the cross-sectional shape of the beam.

Figure 5:
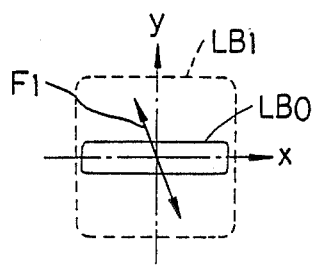
FIG. 5 is a view showing the relation between the oscillating direction of the beam and the cross section thereof.

FIG. 5 shows the cross section of the beams $LB_0$ and $LB_1$. The beam $LB_0$ immediately after emerging from the laser 10 has a rectangular cross section, extended in the x-direction. The beam $LB_0$ (or $LB_1$) shows a higher spatial coherency in the y-direction perpendicular to the x-direction. Consequently, when the rod lenses 28a of the fly's eye lens 28 are arranged in the x- and y-directions as shown in FIG. 6, the interference is very weak between two light spots SP neighboring in the x-direction (longer direction of beam cross section) but is strong between two (or more) light spots SP neighboring in the y-direction (shorter direction of beam cross section).

In a fly's eye lens, there is a very slight difference in the optical path length between a laser beam emerging from a rod lens and reaching the reticle (or wafer) and another laser beam emerging from an adjacent rod lens, so that interference fringes (one- or two-dimensional) are generated on the reticle.

Figure 6:
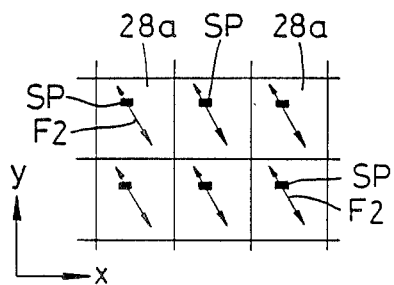
FIG. 6 is a view showing the mode of movement of light spots formed at the exit end of the fly's eye lens.

In the present embodiment, if the direction of cross section of the beam and that of array of rod lenses are determined as shown in FIGS. 5 and 6, there are generated, on the reticle R, one-dimensional interference fringes in which light and dark lines extend in the x-direction and are repeated in the y-direction. In the present embodiment, therefore, the beam $LB_1$ is vibrated by the mirror 20 in a direction F1 crossing the x-direction, as shown in FIG. 5. Thus the light spots SP, formed on the exit side of the rod lenses 28a of the fly's eye lens 28 simultaneously move one-dimensionally in a direction F2 as shown in FIG. 6.

Referring again to FIG. 1, a part of the beam divided by the beam splitter 29 is concentrated on a photosensor 24 through a concentrating optical system 23. Said photosensor 24 is composed for example of a PIN photodiode having sufficient sensitivity in the ultraviolet wavelength range, in order to generate an exact photoelectric signal corresponding to the light amount of each pulse of the beam $LB_0$ (or $LB_1$). Said photoelectric signal is supplied to a light amount monitor circuit 26 which integrates the light amount of the pulses.

The integrated value is supplied to a main control system 8 for exposure control The main control system 8 sends oscillation start and end signals to the trigger control unit 9, and instructions to the light amount control unit 14 for light amount control by the low-speed attenuator 11 or the high-speed attenuator 13. In addition the main control system 8 sends a drive signal to the piezo driver 22 in order to synchronize the pulse generation of the laser 10 with the vibrating angle of the mirror 20.

Said synchronization can also be achieved by triggering the laser 10 according to the angle of the mirror 20. An input/output unit 7, constituting man-machine interface between the operator and the apparatus, receives various parameters required for the exposure from the operator and informs the operator of the status of the apparatus. A memory 6 is used for storing various parameters and tables required for the exposure operation and various calculations In the present embodiment, there is stored, in advance, the information on the minimum necessary number of pulses required in a half cycle of vibration of the mirror 20 for smoothing the interference fringes The half cycle of vibration of the mirror 20 corresponds to the movement of the light spot in the order of SPa - SPb - SPc (or in the reverse order), caused by an inclination of the beam by an angle $\alpha$ in the order of LBa - LBb - LBc (or in the reverse order) The actual inclination angle of the mirror 20 is equal to $\alpha/2$.

In the above-explained structure shown in FIG. 1, the low- and high-speed attenuators 11, 13 are composed of mesh filters of different mesh sizes, but there may be employed a rotatable polarizer if the laser beam $LB_0$ (or $LB_1$) is linearly polarized. In this case the transmittance of the beam can be continuously varied by the rotational position of the polarizer. In addition there may be employed any other structure capable of regulating the light amount, or there may be employed a pulsed laser 10 equipped with means for regulating the light amount of each pulse.

Figure 7:
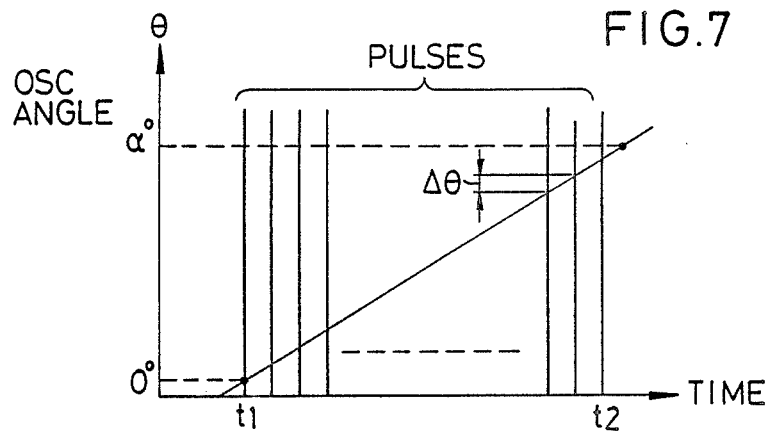
FIG. 7 is a chart showing the relation between the vibrating angle of the beam and the timing of pulse generation.
Figure 8:
FIG. 8 is a chart showing an example of intensity distribution of interference fringes.

Now reference is made to FIGS. 7 and 8 for further explaining the elimination of interference fringes on the illuminated member (reticle R or wafer W), or achieving uniform illumination intensity on said member, by the vibration of the mirror 20.

FIG. 7 schematically shows the change in oscillation angle of the beam $LB_1$ entering the fly's eye lens 28, when the pulses of the laser beam $LB_0$ from the pulsed laser 10 have a fixed frequency (100–500 Hz), wherein the change in oscillation angle in the half cycle of the mirror 20 is assumed to be linear in time. In FIG. 7, 0° and $\alpha°$ in the ordinate respectively correspond to the beams LBa and LBc shown in FIG. 4.

FIG. 8 shows an example of intensity distribution in the y-direction of the interference fringes formed on the illuminated member by a pulse. It will be understood that light lines and dark lines alternate in the y-direction. However, if the fly's eye lens is composed for example of two stages, the basic component of a pitch Yp determined by the pitch of the rod lenses 28a of the fly's eye lens and the wavelength of the laser beam may be superposed with weaker interference fringes of a finer pitch.

In the absence of the oscillating mirror 20, the reticle R always show the interference fringes as shown in FIG. 8 at the same position, and said fringes are reproduced on the exposed pattern on the wafer W. Since the intensity of pulses of an excimer laser shows fluctuation (about ±10%), there are generally generated plural (10–100) pulses at the same position to average said fluctuation, in order to control the exposure with a desired precision. If such plural pulses contain the interference fringes as shown in FIG. 8 always at the same position of the photoresist layer on the wafer W, the uniformity of illumination is apparently insufficient for precise photolithography.

Figure 9:
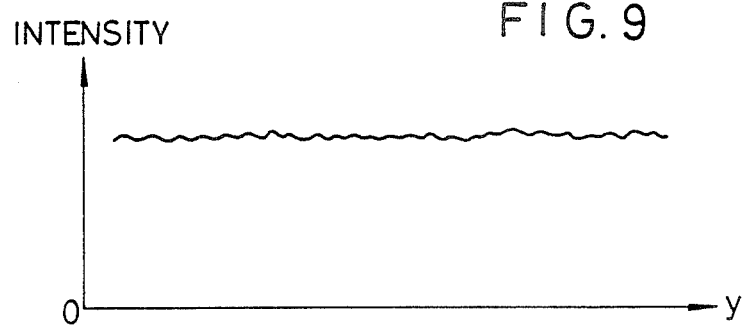
FIG. 9 is a chart showing an example of intensity distribution of smoothed interference fringes.

Consequently, the interference fringes as shown in FIG. 8 are displaced, on the photoresist layer, in the y-direction by a small amount $\Delta Y$ ($<<Yp$) for each of said plural pulses, whereby the interference fringes are smoothed at the end of exposure, and a substantially uniform illumination, with small ripples as shown in FIG. 9 is obtained.

If n pulses are generated during an angular change of the mirror 20 by $\alpha°/2$ from the initial position as shown in FIG. 7, corresponding to the angular change of the incident beam to the fly's eye lens 28 by $\alpha°$ from the initial angle (0°) or to a period from $t_1$ to $t_2$, the change $\Delta\theta$ in the oscillating angle between two pulses is approximately equal to $\alpha/n$, displacing the interference fringes by an amount corresponding to $\Delta Y$ shown in FIG. 8. The substantially uniform illumination intensity as shown in FIG. 9 can be obtained by displacing the interference fringes shown in FIG. 8 exactly by a pitch Yp in the y-direction during the change of the oscillating angle from 0° to $\alpha°$. Consequently the angular change of the mirror 20 and the interval (frequency) of pulses can be so determined as to satisfy a relationship $n\cdot\Delta Y=Yp$.

Thus, for achieving uniform illumination intensity, there are required the following two conditions:

(1) Pulses of a number equal to or larger than $N_{min}$ are generated in substantially uniform manner in the half cycle of the mirror oscillation (period of beam angular change from 0° to $\alpha°$).

Said number $N_{min}$ is determined by the visibility of the interference fringes (speckle) and becomes larger as the visibility increases. Said number $N_{min}$ is determined experimentally for example by a test exposure, and may be different between different apparatuses equipped with different optical systems. Consequently, if the pulses of a number smaller than $N_{min}$ are equally divided in the half cycle of beam angular change 0° to $\alpha°$), there cannot be obtained uniform illumination with a desired precision.

(2) The average light amount of pulse at a certain angular position of the mirror should be constant for the angular range from 0° to $\alpha°$.

This condition can be satisfied by selecting the total number of pulses required for the exposure of an area (one shot) on the wafer as an integral multiple of the number Nm of the pulses during the half cycle of the beam oscillation (however $Nm \geq N_{min}$ from the foregoing condition (1)), and starting the first pulse of the exposure at the maximum angle of the mirror oscillation from 0° to $\alpha°/2$ (for example at 0° providing the beam LBa shown in FIG. 4). If the total number of pulses required for the exposure of one shot is equal to an integral multiple of the number of pulses in a cycle of mirror oscillation (0°–$\alpha°/2$), the first pulse in the exposure may be generated at an arbitrary angle of the mirror oscillation (0°–$\alpha°/2$).

The above-explained situation will be clarified further in the following with reference to the attached drawings.

Figure 10A:
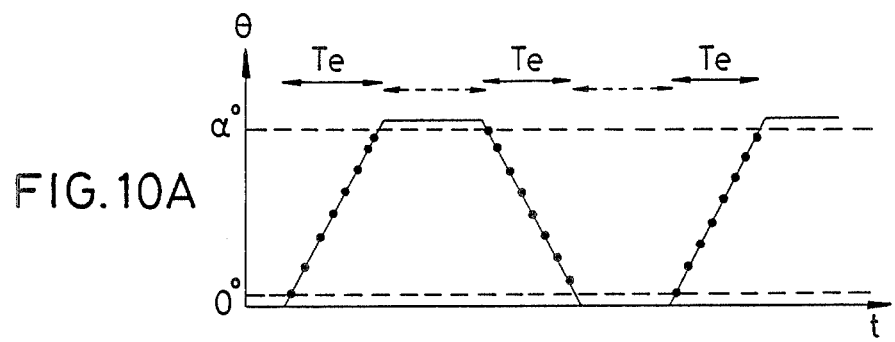
FIGS. 10A, 10B and 10C charts showing examples of the relation between the beam vibration and the timing of pulse generation.
Figure 10B:
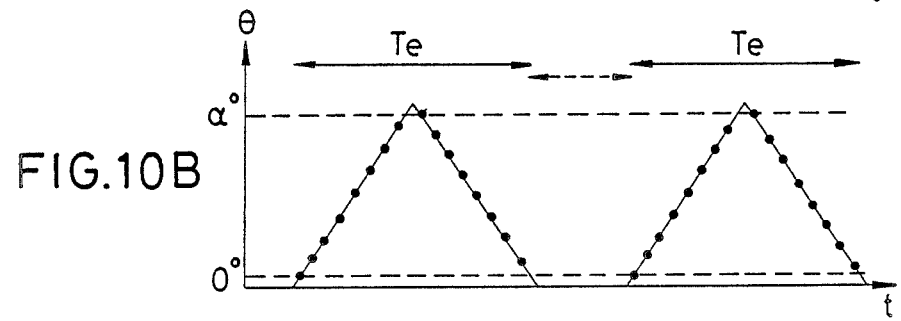
Figure 10C:
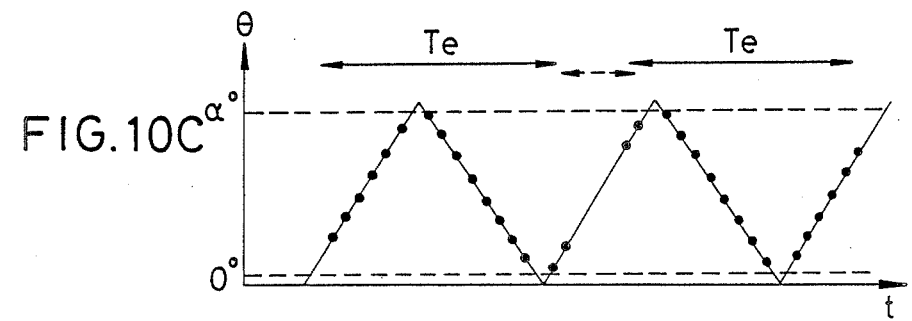

FIGS. 10A, 10B and 10C show the angle of mirror oscillation, or the incident angle $\theta$ of the beam to the fly's eye lens 28 (effectively from 0° to $\alpha°$) in the ordinate as a function of time t in the abscissa, in a case of 8 pulses during the half cycle of the mirror oscillation. A period Te is the exposure period for a shot on the wafer, and the stepping to the next shot is conducted during the interval between the periods Te. Dots shown on the curve of angular change indicate the timings of pulse generation.

FIG. 10A shows a case in which the exposure of a shot is completed in a half cycle of the mirror oscillation. As already explained, an angular change from 0° to $\alpha°$ causes the change in the incident beam from LBa to LBc shown in FIG. 4, corresponding to a displacement of the interference pattern by a pitch as shown in FIG. 8. Consequently two pulses generated at the angles 0° and $\alpha°$ will cause exposures of the same interference pattern on the same position. Consequently, in case of oscillation angle change from 0° to $\alpha°$, the timing is so selected that a pulse is generated at 0° but not at $\alpha°$, and, in case of oscillation angle change from $\alpha°$ to 0°, the timing is so selected that a pulse is generated at $\alpha°$ but not at 0°. Thus, when the exposure of a shot is conducted with pulses of a number close to $N_{min}$, the timing is preferably so determined that the same interference fringe pattern is not superposed at the same position. On the other hand, if the number pulses in the exposure period Te is sufficiently larger than $N_{min}$, for example about 100 pulses, it is scarcely necessary to consider the timing mentioned above.

FIG. 10B shows a case in which the exposure of a shot is completed in a cycle of the mirror oscillation, so that the number of pulses per shot is doubled in comparison with the case of FIG. 10A. If the number of pulses is equal or close to $N_{min}$ in the half cycle of mirror oscillation from 0° to α° or from α° to 0°, the timing of pulses is preferably so selected as to avoid overlapping in the first and second halves of the oscillation angle change (0° and α° being also considered overlapping). However such precaution is not necessary of the number of pulses in the exposure period Te (half cycle of mirror oscillation) is sufficiently larger than $N_{min}$.

FIG. 10C shows another case in which the oscillating mirror 20 continuously oscillates with a certain frequency, and the angular position at the first pulse in the exposure period Te is unfixed. However the number of pulses in any exposure period Te is selected as 8 (equal to or larger than $N_{min}$) in the half cycle of the mirror oscillation, and the exposure of a shot is completed in a cycle of the mirror oscillation.

Based on the foregoing explanation, it will be understood that a uniform illumination intensity and exposure control can be effectively realized at the same time, by regulating the energy of the laser beam LB and determining the optimum number of pulses so as to simultaneously satisfy the aforementioned conditions (1) and (2). Also a change in the oscillation period (speed) of the mirror 20, if combined with the change in the energy of pulse, avoids unnecessary increase in the number of pulses, and is advantageous in through-put.

In the following there will be explained an exposure control method for controlling the integrated energy within a target range.

Figure 11:
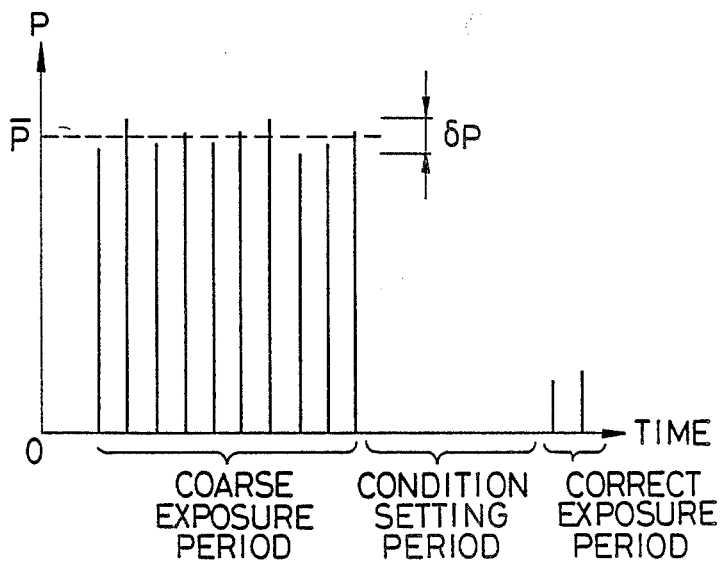
FIG. 11 is a chart showing the mode of time-sequential pulse generation.
Figure 13:
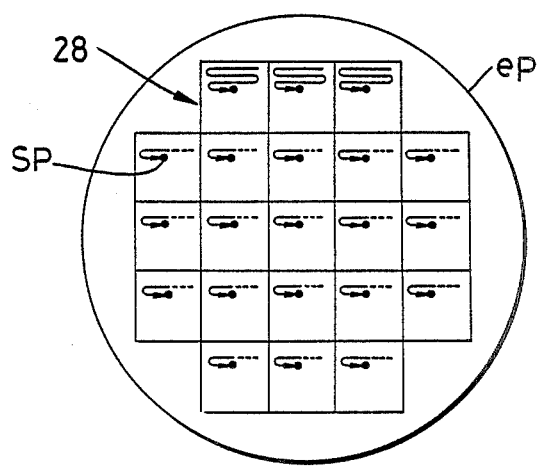
FIG. 13 is a plan view showing light source images on the pupil plane of the projection lens.
Figure 14:
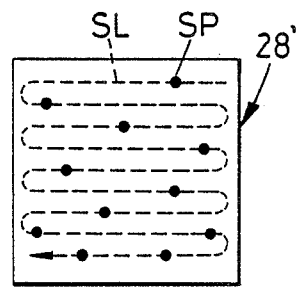
FIG. 14 is a plan view showing the mode of beam scanning on the end face of a lens element of the optical integrator.

In the present embodiment, within the exposure of a shot, there are provided a coarse exposure period in which each pulse has a large energy, and a correcting exposure period containing 1 to 3 pulses of a smaller energy, as shown in FIG. 11, in order to bring the integrated energy detected by the light amount monitor 26 shown in FIG. 1 exactly to a target value or an appropriate exposure value In a pulsed laser, the energy per pulse generally fluctuates around an average value. The average energy per pulse (averaged value for example 100 pulses) at the exposure position (for example on the plane of projected image) is taken as $\overline{P}$, and the amount of fluctuation thereof is taken as δP. It is assumed that the amount of appropriate energy can be represented by N·$\overline{P}$ wherein N is the average number of pulses in the coarse exposure. Also the number of pulses in the correcting exposure is taken as n, and the target control precision of the energy is taken as A (=0.01 in case of 1%). In the present embodiment, the fluctuation in the integrated energy in the correcting exposure directly influences the target appropriate energy. Consequently the maximum correcting exposure energy P' is represented by:

$$P' = N \cdot \overline{P} - \left[ \{N(1+A)\} - \left(1 + \left(\frac{\delta P}{\overline{P}}\right)\right) \right] \overline{P} \quad (1)$$

$$= \left\{1 + \left(\frac{\delta P}{\overline{P}}\right) - A \cdot N \right\} \overline{P}$$

and the fluctuation δP' in each of n pulses of the correcting exposure is represented by:

$$\delta P' = \left\{1 + \left(\frac{\delta P}{\overline{P}}\right) - A \cdot N \right\} \cdot \delta P / \sqrt{n} \quad (2)$$

Thus, the following relationship is obtained from (2), based on a fact that the error in energy control should not exceed A:

$$\frac{\delta P'}{N \cdot \overline{P}} = \frac{\left\{1 + \left(\frac{\delta P}{\overline{P}}\right) - A \cdot N \right\} \cdot \delta P}{N \cdot \overline{P} \sqrt{n}} \leq A$$

This can be rewritten as (3):

$$N \geq \frac{1}{A} \cdot \left(\frac{\delta P}{\overline{P}}\right) \cdot \left\{ \frac{1 + \left(\frac{\delta P}{\overline{P}}\right)}{\sqrt{n} + \left(\frac{\delta P}{\overline{P}}\right)} \right\} \quad (3)$$

In an excimer laser, $\delta P/\overline{P}$ is generally about 10%. In case of A=1% (0.01), the relation (3) provides N=10 or larger for n=1, or N=8 or larger for n=2. Stated differently, if the average number N in coarse exposure is selected larger, the fluctuation in the integrated energy at the end of coarse exposure becomes smaller, so that the number n of pulses in the correcting exposure can be reduced. On the other hand, the total number of pulses should be smaller in consideration of the throughput, so that it is desirable to reduce N by employing plural correcting pulses. In the present embodiment, the coarse exposure is continued with the calculation of integrated energy for each pulse with the photosensor 24 and the monitor 26 shown in FIG. 1, until a point where the integrated value may exceed the target value by a next pulse, in consideration of the possible fluctuation thereof.

More specifically, the discrimination level Rc for discriminating the end of coarse exposure, normalized with the appropriate exposure N·$\overline{P}$ is given by (4):

$$Rc = (1 + A) - \frac{1 + \left[\frac{\delta P}{\overline{P}}\right]}{N} \quad (4)$$

Thus the coarse exposure is continued until the measured integrated light amount, divided by N·$\overline{P}$, exceeds said discrimination level Rc.

In the coarse exposure, the energy is preferably regulated with a maximum transmittance (100%) in the high-speed attenuator 13, and the output energy of the pulsed laser 10 or the low-speed attenuator 11 is so regulated as to obtain the optimum number N (>1) of coarse exposure pulses. In this manner the number N can be maintained low.

Upon completion of the coarse exposure, the number and energy of the correcting pulses are determined from the relation (3), based on the energy thus far integrated, target value, precision A and fluctuation $\delta P/\overline{P}$ in the pulse energy. The energy is controlled by the regulation of the high-speed attenuator 13 at a desired transmittance, and the correcting exposure is conducted with the predetermined number of pulses.

More specifically, the turret plate 16 shown in FIG. 2 and having several mesh filters is suitably rotated to select a filter of desired transmittance. Since the energy transmitted in the correcting exposure is discrete as shown in FIG. 3, there will exist a suitable combination of the transmittance of the mesh filter and the number of correcting pulses for achieving the control precision A, according to the difference (deficiency in exposure) between the target value and the integrated light amount at the end of coarse exposure Also in this case it is preferable to effect confirmation according to the relation (3), assuming that the remaining correcting exposure is conducted with n pulses.

In the following there will be explained the equation for determining the energy adjustment a and the number n of correcting pulses in the correcting exposure. The energy adjustment a is a ratio of the averaged pulse energy in the correcting exposure to the averaged pulse energy $\overline{P}$ in the coarse exposure. Values a, n satisfying:

$$(1-A) - \frac{n - \sqrt{n}\left(\frac{\delta P}{P}\right)}{N} \cdot a < \frac{1}{N \cdot P} < \quad (5)$$

$$(1+A) - \frac{n + \sqrt{n}\left(\frac{\delta P}{P}\right)}{N} \cdot a$$

and $$A > \frac{\sqrt{n}\left(\frac{\delta P}{P}\right)}{N} \cdot a \quad (6)$$

will ensure a control precision ±A for the integrated light amount after the correcting exposure, with respect to the appropriate exposure $N.\overline{P}$, wherein I is the integrated light amount after the coarse exposure.

The above-explained exposure control method can exactly control the integrated value of pulsed energy, or the total exposure to the wafer, with a desired precision.

The present embodiment is characterized by the fact that said exposure control method is combined with the aforementioned method of obtaining uniform illumination. As shown in FIG. 11, the averaged pulse energy in the coarse exposure $\overline{P}$ is larger than that in the correcting exposure, and the integrated light amount in the coarse exposure is significantly larger, naturally, than that in the correcting exposure only. Therefore it is possible to consider that uniform illumination intensity can be obtained principally from the coarse exposure Consequently, in the present embodiment, the coarse exposure may be designed to achieve uniform illumination intensity in consideration of the number of pulses and the oscillation of the mirror 20, and uniform illumination intensity in a correcting exposure need not be particularly considered since the energy per pulse is small Now reference is made to flow charts shown in FIGS. 12A and 12B for explaining control sequences for executing such method.

[Step 100]

At first the operator sets a value corresponding to the appropriate exposure $S_0$ (in mJ/cm$^2$). Said exposure $S_0$ can be determined for example by a test exposure and by the integrated value shown in the light amount monitor 26 when a desired integrated energy is given to the photoresist layer of the wafer. It is assumed that the coefficient K of proportionality is determined in advance between the integrated energy S given to the photoresist and the corresponding integrated value I of the monitor 26. It is also assumed that the low-speed attenuator 11 and the high-speed attenuator 13 shown in FIG. 1 are both preset at a transmittance of 100%.

[Step 101]

Then the average energy $\overline{P}$ per pulse (in mJ/cm$^2$·pulse) on the exposure plane is measured with the photosensor 24 and the light amount monitor 26. The influence of fluctuation in the energy per pulse is canceled by the averaging of plural pulses For a number $N_{dm}$ of said plural pulses and the output I of the monitor 26, the average energy $\overline{P}$ can be determined from the equation (7) with a coefficient K:

$$\overline{P} = I/(K \cdot N_{dm}) \quad (7)$$

The integrated value I on the projected image plane can also be detected, instead of the monitor 26, by a photoelectric sensor (illumination meter) placed on the X-Y stage for supporting the wafer W. In the use of such photoelectric sensor on the wafer stage, the output thereof has to be calibrated by that of the photosensor 24.

The photoelectric detection on the projected image plane is to be conducted in a position where the pattern (image of reticle pattern) is absent.

[Step 102]

Then the main control system 8 determines the average number N of pulses of the coarse exposure from the following equation (8), based on the measured average energy $\overline{P}$ per pulse and the appropriate exposure $S_0$:

$$N = int(S_0/\overline{P}) \quad (8)$$

The equation (8) means the integral part of $S_0/\overline{P}$.

[Step 103]

On the other hand, the minimum number $N_{min}$ of pulses in a half cycle of the oscillating mirror 20 is experimentally determined in advance and stored in the memory 6. The main control system 8 reads said number $N_{min}$ and proceeds to the next step.

[Step 104]

Then the main control system 8 determines the minimum necessary number Nc of pulses in the coarse exposure required for securing the precision A (%) in the exposure control. Said determination may be conducted simultaneously with that of the average energy $\overline{P}$ in the step 101. Said pulse number Nc is determined from an equation (9) equivalent to (3):

$$Nc = \text{int}\left[\frac{1}{A} \cdot \left(\frac{\delta P}{P}\right) \cdot \left\{\frac{1 + \left(\frac{\delta P}{P}\right)}{\sqrt{n} + \left(\frac{\delta P}{P}\right)}\right\} + 1\right] \quad (9)$$

Also the main control system 8 discriminates whether the pulse number N determined in the step 102 is larger than the minimum number Nc obtained by the equation (9) and the minimum pulse number $N_{min}$ in a half cycle. If at least either of Nc and $N_{min}$ is larger than N, the sequence proceeds to a step 105 as the desired exposure precision A or the smoothing of interference fringes cannot be attained.

[Step 105]

The light amount of the beam is attenuated by a predetermined proportion, for example by the low-speed attenuator 11 shown in FIG. 1. It is naturally possible also to attenuate the laser beam by the laser 10 itself. The main control system 8 memorizes the exact rate of attenuation A.

The rate of attenuation is approximately determined by $N/\max(Nc, N_{min})$.

[Step 106]

The main control system 8 discriminates whether the step 101 is to be executed again. The sequence proceeds to the step 101 or a step 107, respectively if the re-measurement is selected or not.

[Step 107]

The average number N of pulses in the coarse exposure is modified according to the rate of attenuation Am determined in the step 105, in the following manner:

$$N' = N/Am$$

wherein N' is the modified number of pulses.

[Step 108]

Then the main control system 8 determines the level Rc for discriminating the end of coarse exposure, according to the aforementioned relation (4), in which N is replaced by N' if it is newly selected in the step 107.

At the same time there is determined the number Nm ($\geq N_{min}$) of pulses in a half cycle of the oscillating mirror 20, by the main control system 8 according to the following equation:

$$N_m = N/\text{int}(N/N_{min})$$

More specifically, this calculation is conducted by dividing the pulse number N (or N') with the integral part of the quotient obtained by dividing the average pulse number N (or N') in the coarse exposure with $N_{min}$.

[Step 109]

Then the mirror 20 is set at the maximum required angular position ($\alpha°$), and the filter 16a of a transmittance 1.0 of the turret plate 16 of the high-speed attenuator 13 is aligned with the beam $LB_1$ to initialize the energy (100% transmission).

When the preparation for exposure is completed in this state, the wafer W is stepped to a predetermined position (directly below the projection lens PL) by the X-Y stage, and is fixed at a position where a shot area on the wafer is aligned with the reticle R. Then the coarse exposure is initiated, and a sequence starting from a step 110 is simultaneously started.

[Step 110]

The oscillating mirror 20 is varied by a step ($\Delta\alpha°$), and a pulse in the coarse exposure is generated through trigger control unit 9.

Said one-step angle $\Delta\alpha°$ is determined as follows:

$$\Delta\alpha = \alpha \text{ (maximum deflecting angle)}/Nm$$

[Step 111]

In response to a pulse generated in the step 111, the light amount monitor 26 generates a new integrated value I, by adding a value corresponding to the light amount of a pulse to the preceding integrated value. The main control system 8 reads said integrated value I and determines the ratio R of the actual exposure to the appropriate exposure, according to the following equation:

$$R = I/(K \cdot S_0)$$

[Step 112]

Then the main control system 8 compares the aforementioned discrimination level Rc with R, and the sequence proceeds to a step 113 in case of $R \geq Rc$, but returns to the step 110 in case of $R < Rc$. The coarse exposure pulses of a number Nm are given to the reticle, with a change in the beam angle by $\Delta\alpha°$ each time during a half cycle of mirror oscillation, by the repetition of the above-explained steps 110–112.

[Step 113]

The main control system 8 discriminates whether the required control precision A is already satisfied at the end of the coarse exposure, through a comparison $R \geq (1-A)$. The sequence proceeds to a next step 117 in case of $R \geq (1-A)$, but to a step 114 for correcting exposure in case of $R < (1-A)$.

[Step 114]

The main control system 8 determines the energy adjustment (attenuation) a and the number n of pulses required in the correcting exposure, based on the relations (5) and (6). A suitable mesh filter of the high-speed attenuator 13 (cf. FIG. 2) is automatically selected and set according to said energy adjustment a. In the use of mesh filters as shown in FIG. 2, the number of correcting pulses is generally in a range of 1 to 5, since the required adjustment a ($0 < a < 1$) is given by a discrete value.

[Step 115]

A pulse for correcting exposure is generated. The mirror 20 continues to be deflected by a step ($\Delta\alpha°$) in succession to the coarse exposure. By the time of correcting exposure, the unevenness in the illumination intensity caused by the interference fringes (one-dimensional speck pattern) on the wafer has been almost eliminated, so that the synchronization between the mirror angle and the pulse generation need not be particularly considered.

[Step 116]

There is discriminated whether the number of pulses in the correcting exposure has reached the predetermined number n, and, if not, the sequence returns to the step 115 to continue the correcting exposure. Upon completion of the correcting exposure, the sequence proceeds to a step 117.

[Step 117]

There is discriminated whether the exposure is to be conducted in a next shot area on the wafer. If the exposure is to be conducted, the X-Y stage is stepped, and the sequence returns to the step 109 for initializing the angle of the mirror 20 and the transmittance of the high-speed attenuator 13 (at a=1.0).

The exposure sequence of a wafer is completed when all the shot areas on the wafer are exposed.

Figure 12A:
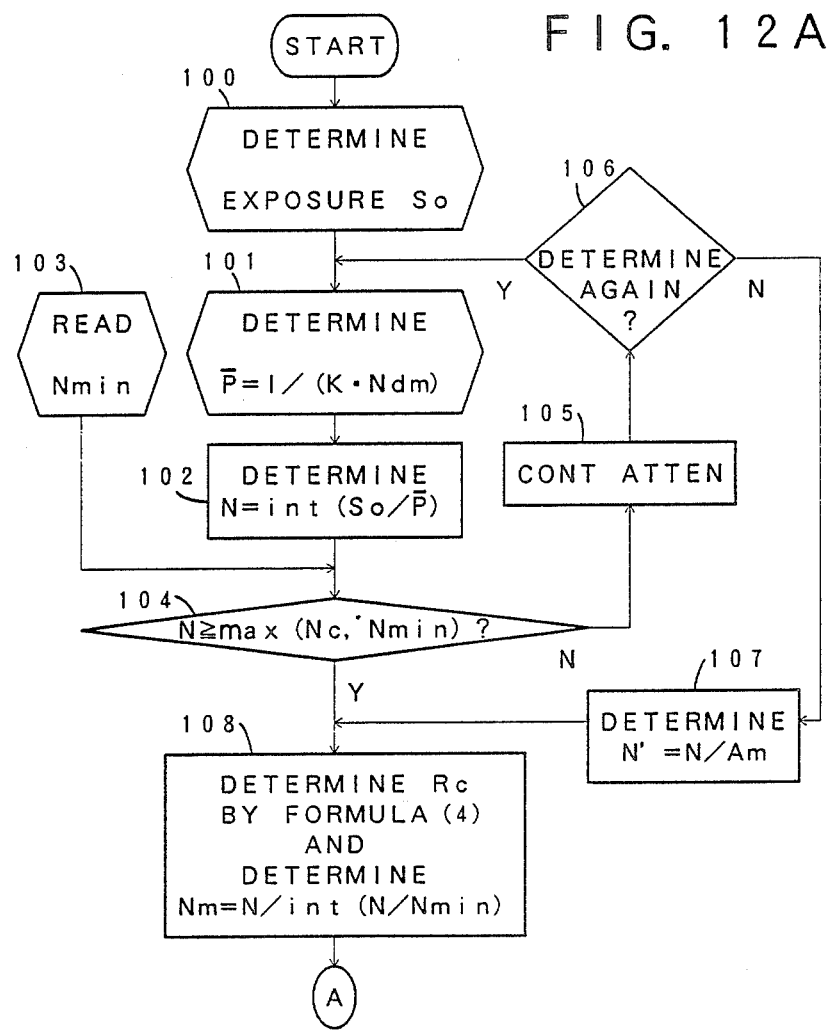
FIGS. 12A and 12B are flow charts showing representative function of an embodiment.
Figure 12B:
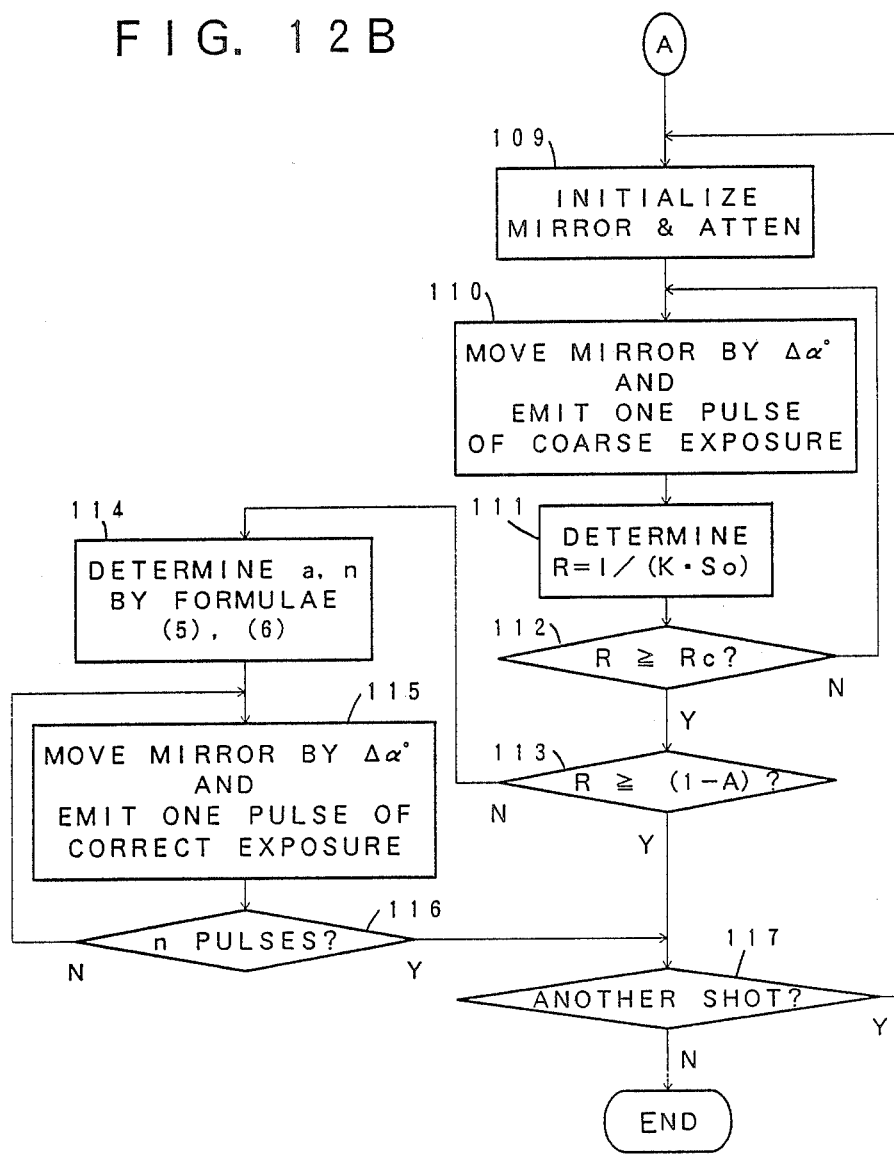

As explained in the foregoing, the control sequence according to the flow charts shown in FIGS. 12A and 12B enables the exposure operation with exposure control of a required precision and without unevenness in the illumination intensity resulting from interference fringes.

In the foregoing embodiment it is assumed that the coarse exposure is completed during a half cycle of the oscillation of the mirror 20, but it is also possible to adopt the timing of pulse generation as shown in FIG. 10B or 10C. It is also possible to synchronize the pulse generations (pulse number being h×Nm in which h is an integer) over a period longer, by a multiple of half cycle, then a cycle of the mirror oscillation.

In the foregoing description, the oscillating angle of the mirror 20 is so defined as to obtain incident beam positions to the fly's eye lens 28 which are symmetrically inclined on both sides of the optical axis AX as shown in FIG. 4, but such symmetry on both sides is not essential.

Also in the foregoing embodiment, the mirror 20 is oscillated in one-dimension only, since the interference fringes are generated principally one-dimensionally in the direction of array of the fly's eye lens 28, but, in case of two-dimensional random speckles or two-dimensional interference fringes, it becomes necessary to support the mirror 20 with a gimbal mechanism and oscillate it with piezo elements, or to employ two scanning mirrors with mutually orthogonal oscillating axes. Also in such case there can be obtained the same advantages by determining, respectively in the X- and Y-directions of beam oscillation, the minimum numbers $N_{min(x)}$, $N_{min(y)}$ of pulses required for eliminating the speckles or interference fringes in said directions, and controlling the optimum exposure based on said minimum number of pulses. It is also possible to utilize a diagonal one-dimensional oscillation of the mirror 20 having X- and Y-components therein.

In the above-explained flow charts, if the number Nm of pulses in a half cycle is close to the minimum pulse number $N_{min}$ in case the coarse exposure is completed in said half cycle of mirror oscillation, the number of actually generated pulses may become smaller than $N_{min}$ after repeated loops of the steps 110–112 due to an incremental fluctuation of the average energy $\bar{P}$ per pulse in the actual exposure. Such inconvenience can be prevented by defining a number $N_{min} + \sqrt{N_{min}}$ and effecting the determination of Nm in the step 108 according to a condition $Nm > N_{min} + \sqrt{N_{min}}$.

In the exposure control of the foregoing embodiment, the required precision is attained by the of a correcting exposure. However, if the average number N (or N') of pulses in the coarse exposure is selected sufficiently large by the use of a low-speed attenuator 11 or a high-speed attenuator 13 capable of continuously varying the rate of attenuation, or by a combination of a high-speed attenuator 11 and a low-speed attenuator 13 of discrete energy levels, the correcting exposure is scarcely necessary and may be eventually dispensed with. The selection of a sequence involving such correcting exposure or a sequence without such correcting exposure is made in consideration of the throughput, or the exposure time per shot. In the presence of the correcting exposure, the total exposure time additionally includes, as shown in FIG. 11, a time required for determining and setting the energy and number of the correcting pulses, and a correcting exposure time. It is also effective, therefore, to incorporate a control sequence for calculating, in advance, the total exposure time of a mode in which the exposure is achieved by the coarse exposures only, with a reduced average energy $\bar{P}$ per pulse, and select a faster control sequence.

The embodiment shown in FIG. 1 utilizes only one fly's eye lens 28 as the optical integrator, but there may also be employed two equivalent integrators as disclosed in the U.S. Pat. No. 4,497,015. Such arrangement provides secondary light source images (light spots of laser beam) of a number $m_1 \times m_2$ on the pupil ep of the projection lens PL, wherein $m_1$ and $m_2$ are respectively numbers of rod lenses in said integrators, thereby achieving more precise uniformity of the illumination intensity.

What is claimed is:

1. An exposure control device, comprising:
   an illumination optical system comprising means for generating a coherent pulsed light beam, and adapted for irradiating a second object with said pulsed light beam through a first object having a pattern thereon, thereby transforming said pattern onto said second object;
   means, provided in said illumination optical system, for displacing a speckle pattern, formed on said first and second objects with a specific periodicity by means of said pulsed beam, over a predetermined range and in predetermined directions on said first and second objects;
   means for storing, in advance, a number of pulses of said light beam required for substantially smoothing the integrated exposure amount over the entire area of said second object when plural pulses of said light beam are generated during the displacement of said speckle pattern over said predetermined range; and
   means for determining the number of pulses of said light beam required for giving a predetermined exposure to said second object, the intensity of each pulse of said light beam given by said illumination optical system, and the number of pulses per cycle of the displacement of said speckle pattern, said determining being based on said stored number of pulses.

2. A device according to claim 1, further comprising means for controlling said illumination optical system in response to the function of said determining means.

3. A device according to claim 1, wherein said illumination optical system comprises means for regulating the energy of said pulsed light beam arriving at said first object.

4. A device according to claim 3, wherein said determining means comprises means for integrating the energy of said pulsed light beams arriving at said first object.

5. A device according to claim 4, wherein said determining means comprises means for controlling said regulating means in such a manner that pulses of said light beam of a relatively large energy are generated until said integrated energy of said pulsed light beam exceeds a predetermined value smaller than a target value, and that pulses of said light beam of a relatively small energy are generated after said integrated energy exceeds said predetermined value and until said integrated energy reaches said target value.

* * * * *